United States Patent [19]
McMahon

[11] Patent Number: 5,671,121
[45] Date of Patent: Sep. 23, 1997

[54] KANGAROO MULTI-PACKAGE INTERCONNECTION CONCEPT

[75] Inventor: John Francis McMahon, Phoenix, Ariz.

[73] Assignee: Intel Corporation, Santa Clara, Calif.

[21] Appl. No.: 594,334

[22] Filed: Jan. 30, 1996

Related U.S. Application Data

[63] Continuation of Ser. No. 315,571, Sep. 29, 1994, abandoned.

[51] Int. Cl.⁶ .................................................. H05K 7/20
[52] U.S. Cl. .................. 361/719; 257/724; 361/790; 439/70; 439/264; 439/525
[58] Field of Search .......................... 361/688, 697, 361/702, 704, 717–719, 723, 760, 761, 764, 768, 773, 784, 785, 790, 791, 813; 174/16.3, 260; 165/185, 80.3; 257/675, 690, 686, 697, 706, 707, 713, 722–724, 787; 439/55, 68–70, 71, 74, 263, 264, 265, 485, 487, 525, 526

[56] References Cited

U.S. PATENT DOCUMENTS

| | | | |
|---|---|---|---|
| 4,192,565 | 3/1980 | Gianni | 339/17 CF |
| 4,549,127 | 10/1985 | Taylor | 320/21 |
| 4,617,708 | 10/1986 | Fanning | 29/25.42 |
| 4,750,092 | 6/1988 | Werther | 361/400 |
| 4,953,060 | 8/1990 | Lauffer | 361/388 |
| 5,247,423 | 9/1993 | Lin | 361/719 |
| 5,257,165 | 10/1993 | Chiang | 361/748 |
| 5,309,324 | 5/1994 | Herendy | 361/734 |
| 5,327,326 | 7/1994 | Komoto | 361/785 |
| 5,384,692 | 1/1995 | Jaff | 361/785 |

*Primary Examiner*—Gerald P. Tolin
*Attorney, Agent, or Firm*—Blakely, Sokoloff, Taylor & Zafman

[57] ABSTRACT

A printed circuit board assembly that has a first electronic package which is coupled to a printed circuit board and a second electronic package that is plugged into the first electronic package. The first electronic package can be coupled to the printed circuit board by leads, pins that plug into corresponding sockets mounted to the circuit board, or a SMT socket adapter that is mounted to the board. The first package also has a plurality of pins that extend through an opening in the printed circuit board. The second package has a plurality of sockets that can be plugged onto the pins of the first package to couple the second package to the first package.

25 Claims, 2 Drawing Sheets

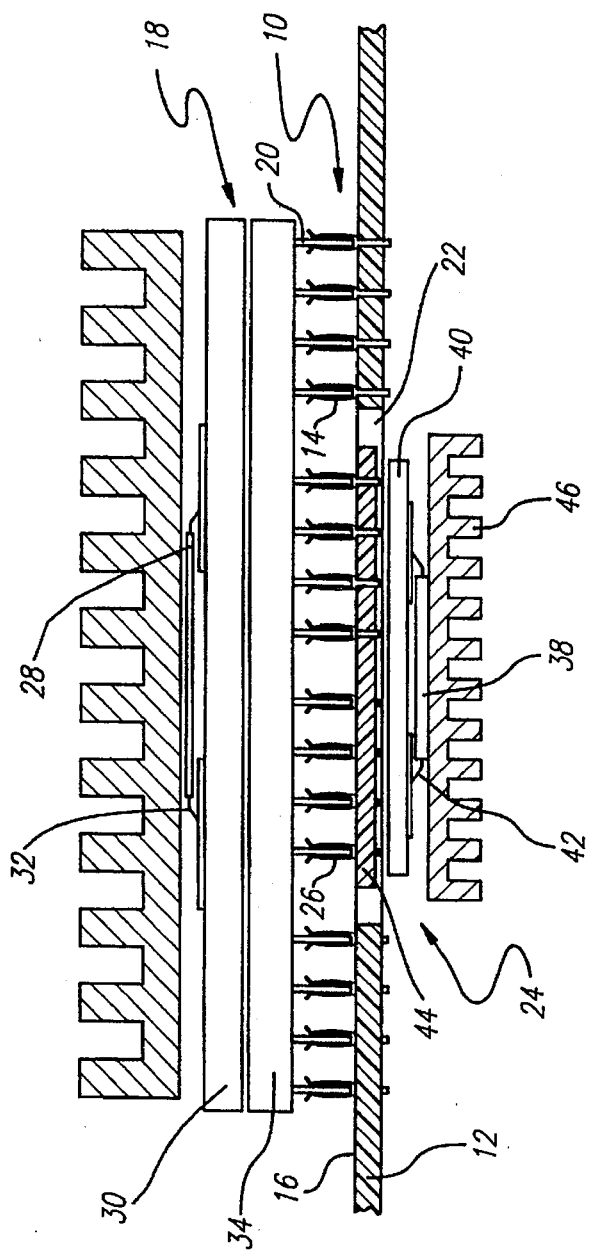
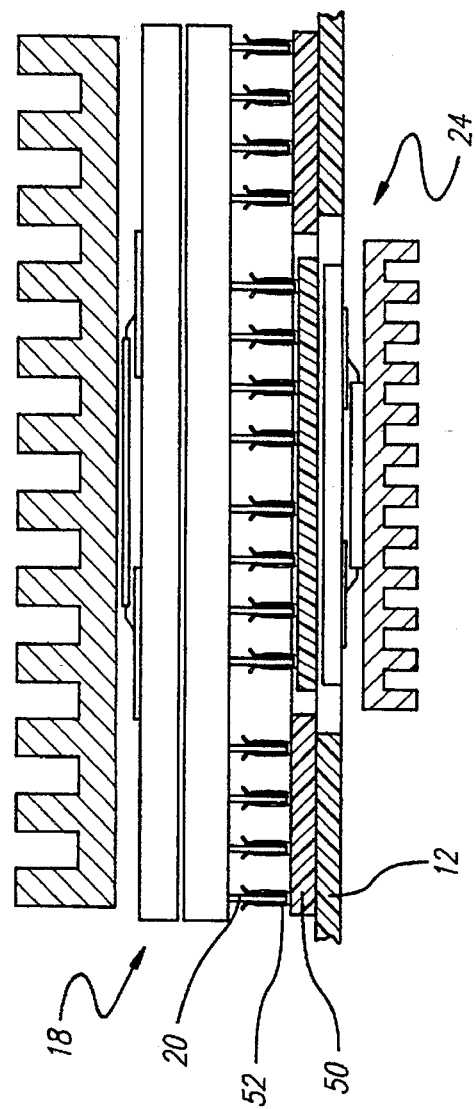

KANGAROO MULTI-PACKAGE INTERCONNECTION CONCEPT

This is a continuation of application Ser. No. 08/315,571, filed Sep. 29, 1994, now abandoned.

BACKGROUND OF THE INVENTION

1. Field of the Invention

The present invention relates to an electronic package assembly.

2. Description of Related Art

Integrated circuits are commonly housed within a package that is mounted to a printed circuit board. The packages are typically soldered to surface pads or plated through holes of the board. It is sometimes desirable to replace the integrated circuit package(s) of a printed circuit board assembly. For example, it may be desirable to replace an inoperable package or upgrade the system with a new device. Replacing the package typically requires reflowing the solder of the board. Reflowing the solder is a time consuming process that requires dedicated equipment. Additionally, reflowing the solder can degrade the material of the printed circuit board.

Some printed circuit board assemblies have a surface mounted technology (SMT) socket adapter that is solder to the printed circuit board and which contains a plurality of connector sockets. The integrated circuit package has a plurality of corresponding pins that plug into the sockets. The integrated circuit package can be removed from the board by merely pulling the package out of the SMT socket.

Adding an additional device to a printed circuit board assembly requires an additional array of surface pads or plated through holes. To limit the size of the board, most commercially available printed circuit board assemblies do not have additional pads/holes for additional devices. It would be desirable to provide a printed circuit board assembly that would allow a secondary electronic package to be plugged into a primary electronic package. For example, if the primary package contains a microprocessor, it would be desirable to plug a second device such as a cache memory device, a voltage regulator or a power/ground supply directly to the processor package without soldering or reflowing solder in the assembly.

SUMMARY OF THE INVENTION

The present invention is a printed circuit board assembly that has a first electronic package which is coupled to a printed circuit board and a second electronic package that is plugged into the first electronic package. The first electronic package can be coupled to the printed circuit board by leads, pins that plug into corresponding sockets mounted to the circuit board, or a SMT socket adapter that is soldered directly to the printed circuit board. The first package also has a plurality of pins that extend through an opening in the printed circuit board. The second package has a plurality of sockets that can be plugged onto the pins of the first package to couple the second package to the first package.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a cross-sectional view of a printed circuit board assembly of the present invention;

FIG. 2 is an alternate embodiment of the assembly of FIG. 1;

DETAILED DESCRIPTION OF THE INVENTION

Figure 3:
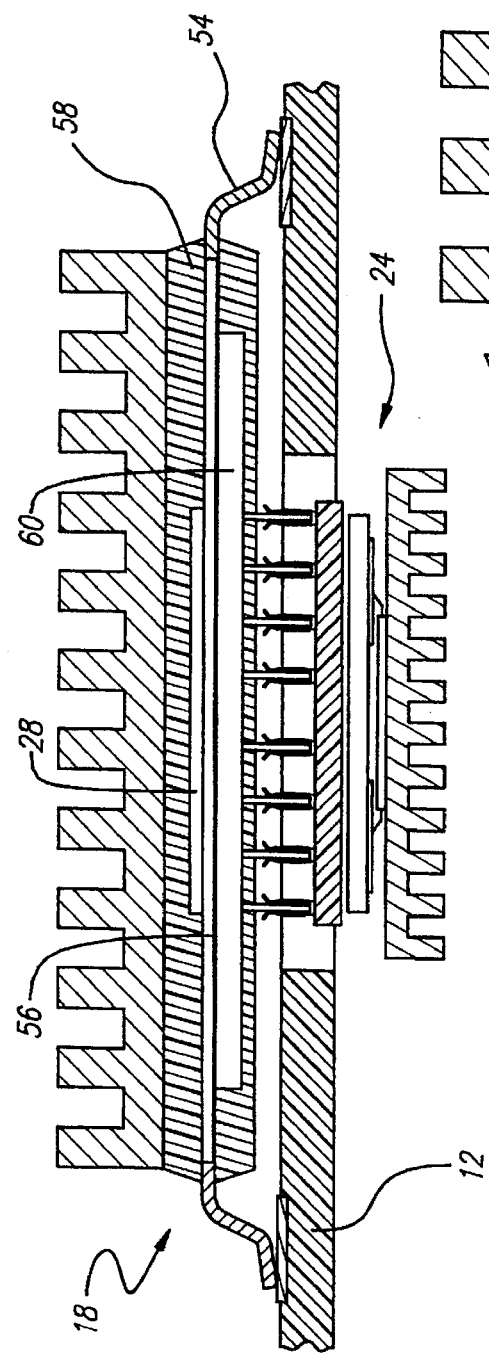
FIG. 3 is an alternate embodiment of the assembly of FIG. 1.

Referring to the drawings more particularly by reference numbers, FIG. 1 shows a printed circuit board assembly 10 of the present invention. The assembly 10 includes a printed circuit board (PCB) 12 which has a plurality of PCB connector sockets 14 extending from a first side 16 of the board 12. The assembly 10 also contains a first electronic package 18 that has a plurality of pins 20. Some of the pins 20 are inserted into the sockets contacts 14 of the printed circuit board 12. The sockets 14 and the pins 20 electrically and mechanically couple the package 18 to the board 12. The sockets 14 each contain flexible fingers which can be deflected to provide a spring force on the pins 20 to create a rugged attachment between the package 18 and the circuit board 12.

The first package 18 has a center set of pins 20 that extend into an opening 22 in the printed circuit board 12. The assembly 10 further contains a second electronic package 24 which has a plurality of socket connectors 26 that can be plugged onto the pins 20 that extend into the PCB opening 22. The pins 20 and sockets 14 electrically and mechanically couple the second package 24 to the first package 18.

The first package 18 contains an electrical device 28 that is coupled to an internal printed circuit board 30 by a TAB (tape automated bonding) tape interconnect 32. The device 28 is typically enclosed by an encapsulant (not shown). The electrical device 28 may be an integrated circuit such as a microprocessor. The pins 20 are soldered to the internal circuit board 30 and typically supported by a plastic housing 34. The internal circuit board 30 couples the device 28 to the pins 20 and the circuit board 12. The routing within the internal circuit board 30 may also connect the second package 24 directly to the printed circuit board 12. A first heat sink 36 may be coupled to the first package 18 to improve the thermal efficiency therein.

The second package 24 also contains an electrical device 38 that is coupled to an internal printed circuit board 40 by a TAB tape interconnect 42. The sockets 26 are supported by a housing 44 and connected to the device 38 through the internal circuit board 40. The package 24 may further contain a heat sink 46 that is coupled to the device 38.

The device 38 may be an integrated circuit or a passive element. By way of example, the device 28 within the first package 18 may be a microprocessor and the device 38 within the second package 24 may be a second level cache memory device. The memory device may be connected to both the device 28 and the printed circuit board 12. Alternatively, the device 28 may be a voltage regulator or a dedicated power/ground supply. The power supply may be connected to other components on the printed circuit board 12. The packaging scheme of the present invention will thus allow an end user to readily add an additional device such as memory, power/ground supply or voltage regulator to a microprocessor.

FIG. 2 shows an alternate embodiment of a printed circuit board assembly that includes a surface mounted technology (SMT) socket adapter 50. The SMT socket adapter 50 is mounted to the printed circuit board 12 and has a plurality of socket connectors 52 that mate with corresponding pins 20 of the first package 18. The adapter 50 provides a means to readily disconnect the first package 18 from a surface mounted printed circuit board 12.

FIG. 3 shows another alternate embodiment of a printed circuit board assembly, wherein the first package 18 has a plurality of leads 54 that are surface mounted to the printed circuit board 12. The leads 54 may be part of a lead frame 56 that is attached to the device 28 and encapsulated by a plastic package 58. The lead frame 56 may also be connected to an internal printed circuit board 60 which supports and routes the pins 20 that are coupled to the second package 24. It is understood that the first 18 and second 24 packages may be assembled from any known packaging techniques including flip-chip, plastic and ceramic package processes.

Figure 4:
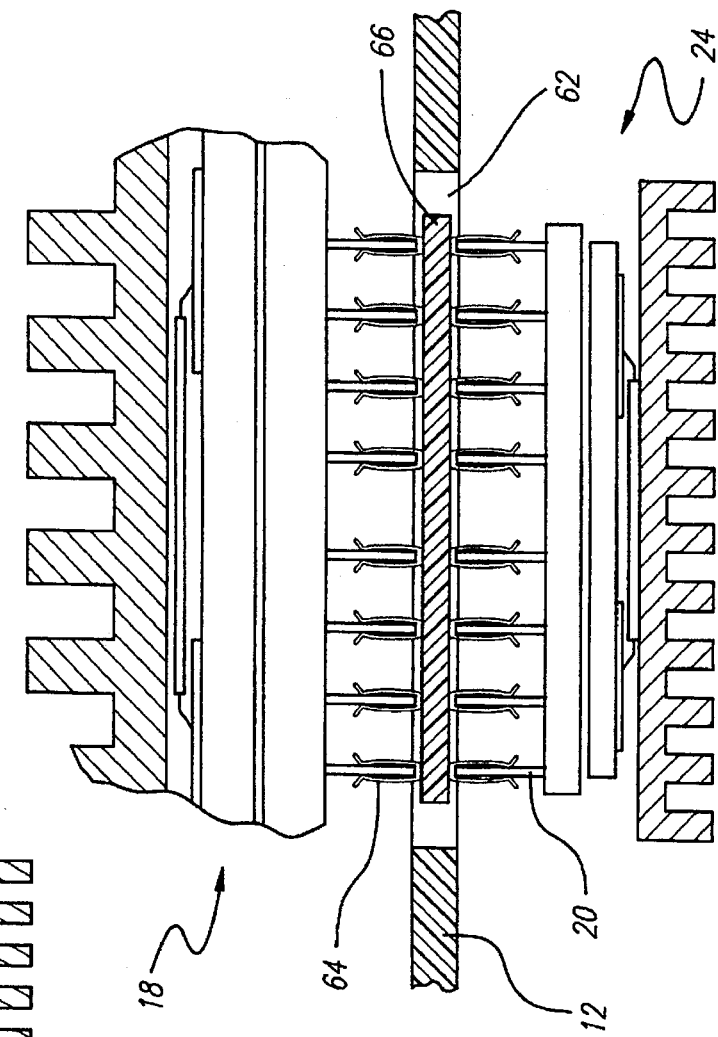
FIG. 4 is an alternate embodiment of the assembly of FIG. 1.

FIG. 4 shows a socket adapter 62 which has a plurality of sockets 64 the extend from both sides of a housing 66. The socket adapter 62 can be used to couple a first package 18 to a second package 24 which has pins 20 extending from the package 24 instead of the sockets 26 shown in FIGS. 1–3.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A printed circuit board assembly, comprising:
    a printed circuit board that has a first surface, an opposite second surface and a center opening;
    a first electronic package that is mounted to said first surface of said printed circuit board and which has a plurality of first connectors extending from a bottom surface of said first electronic package, wherein at least one of said first connectors is mounted to said first surface of printed circuit board; and,
    a second electronic package that is adjacent to said second surface of said printed circuit board and has a second connector that extends from a top surface of said second electronic package and which is connected to one of said first connectors of said first electronic package through said center opening of said printed circuit board.

2. The assembly as recited in claim 1, wherein said first connectors are pins and said second connector is a are socket.

3. The assembly as recited in claim 1, further comprising an adapter that is mounted to said printed circuit board and which contains a socket that receives at least one of said first connectors of said first electronic package.

4. The assembly as recited in claim 1, further comprising an adapter that has a first socket that receives at least one of said first connectors of said first electronic package and a second socket that receives said second connector of said second electronic package.

5. The assembly as recited in claim 1, wherein said first electronic package is surface mounted to said printed circuit board.

6. The assembly as recited in claim 1, further comprising a heat sink mounted to said first electronic package.

7. The assembly as recited in claim 1, further comprising a heat sink mounted to said second electronic package.

8. The assembly as recited in claim 1, wherein said first electronic package contains a microprocessor and said second electronic package contains a memory device.

9. The assembly as recited in claim 1, wherein said first electronic package contains a microprocessor and said second electronic package contains a power supply.

10. The assembly as recited in claim 1, wherein said first electronic package contains a microprocessor and said second electronic package contains a voltage regulator.

11. A printed circuit board assembly, comprising:
    a printed circuit board that has a center opening, said printed circuit board has a first surface and an opposite second surface;
    a socket adapter that is mounted to said printed circuit board, said socket adapter having a socket and a center opening;
    a first electronic package that is mounted to said first surface of said printed circuit board and which a plurality of pins that extend from a bottom surface of said first electronic package, wherein at least one of said first pins is mated with said socket of said printed circuit board and one of said first pins is mated with said socket of said socket adapter; and,
    a second electronic package that is adjacent to said second surface of said printed circuit board and has a connector that extends from a top surface of said second electronic package and which is connected to at least one of said pins of said first electronic package through said center openings of said socket adapter and said printed circuit board.

12. The assembly as recited in claim 11, further comprising a first heat sink mounted to said first electronic package and a second heat sink mounted to said second electronic package.

13. The assembly as recited in claim 11, wherein said first electronic package contains a microprocessor and said second electronic package contains a memory device.

14. The assembly as recited in claim 11, wherein said first electronic package contains a microprocessor and said second electronic package contains a power supply.

15. The assembly as recited in claim 11, wherein said first electronic package contains a microprocessor and said second electronic package contains a voltage regulator.

16. A printed circuit board assembly, comprising:
    a printed circuit board that has a center opening, a first surface, an opposite second surface, and a surface pad on said first surface;
    a first electronic package that is mounted to said first surface of said printed circuit board and which has a pin that extends from a bottom surface of said first electronic package, and a lead that is mounted to said surface pad of said printed circuit board; and,
    a second electronic package that is adjacent to said second surface of said printed circuit board and has a socket that extends from a top surface of said second electronic package and which is connected to said pin of said first electronic package through said center opening of said printed circuit board.

17. The assembly as recited in claim 16, further comprising a first heat sink mounted to said first electronic package and a second heat sink mounted to said second electronic package.

18. The assembly as recited in claim 16, wherein said first electronic package contains a microprocessor and said second electronic package contains a memory device.

19. The assembly as recited in claim 16, wherein said first electronic package contains a microprocessor and said second electronic package contains a power supply.

20. The assembly as recited in claim 16, wherein said first electronic package contains a microprocessor and said second electronic package contains a voltage regulator.

21. A printed circuit board assembly, comprising:

a printed circuit board that has a center opening, a first surface and an opposite second surface;

an adapter that is located within said center opening of said printed circuit board, said adapter having a plurality of sockets;

a first electronic package that is mounted to said first surface of said printed circuit board and which has a plurality of pins that extend from a bottom surface of said first electronic package, wherein at least one pin is mated with said socket of said adapter and mounted to said printed circuit board; and, a second electronic package that is adjacent to said second surface of said printed circuit board and has a pin that extends from a top surface of said second electronic package and which is connected to at least one of said sockets of said adapter.

22. The assembly as recited in claim 21, further comprising a first heat sink mounted to said first electronic package and a second heat sink mounted to said second electronic package.

23. The assembly as recited in claim 21, wherein said first electronic package contains a microprocessor and said second electronic package contains a memory device.

24. The assembly as recited in claim 21, wherein said first electronic package contains a microprocessor and said second electronic package contains a power supply.

25. The assembly as recited in claim 21, wherein said first electronic package contains a microprocessor and said second electronic package contains a voltage regulator.

\* \* \* \* \*